United States Patent [19]

Herberg

[11] Patent Number: 4,502,071
[45] Date of Patent: Feb. 26, 1985

[54] FET CONTROLLED THYRISTOR

[75] Inventor: Helmut Herberg, Munich, Fed. Rep. of Germany

[73] Assignee: Siemens Aktiengesellschaft, Berlin & Munich, Fed. Rep. of Germany

[21] Appl. No.: 344,061

[22] Filed: Jan. 29, 1982

[30] Foreign Application Priority Data

Mar. 31, 1981 [DE] Fed. Rep. of Germany ....... 3112940

[51] Int. Cl.³ .................... H01L 29/74; H01L 29/78; H01L 27/02; H01L 29/167
[52] U.S. Cl. .................. 357/38; 357/23.4; 357/43; 357/64; 357/86
[58] Field of Search ............ 357/23, 38, 86, 64, 357/43

[56] References Cited

U.S. PATENT DOCUMENTS

| 3,442,722 | 5/1969 | Bauerlein et al. | 357/38 |
| 3,590,346 | 6/1971 | Bilo et al. | 357/38 |
| 3,891,866 | 6/1975 | Okuhara et al. | 357/38 |
| 4,165,517 | 8/1979 | Temple et al. | 357/38 |
| 4,224,634 | 9/1980 | Svedberg | 357/38 |

FOREIGN PATENT DOCUMENTS

| 1055165 | 5/1979 | Canada | 357/38 A |
| 2945347 | 5/1981 | Fed. Rep. of Germany . | |
| 52-35586 | 3/1977 | Japan | 357/38 T |
| 55-27641 | 2/1980 | Japan | 357/38 G |

OTHER PUBLICATIONS

Hoffmann, A., et al., "Thyristor-Handbuch", Siemens-Schuckertwerke AG, 1965, pp. 27–28.

Primary Examiner—Andrew J. James
Assistant Examiner—John Lamont
Attorney, Agent, or Firm—Hill, Van Santen, Steadman & Simpson

[57] ABSTRACT

A thyristor has a pair of opposite conductivity bases between and respectively adjacent to opposite conductivity emitters. An auxiliary emitter serves for internal current gain and is provided with an auxiliary emitter cathode. In order to meet the mutually-contradictory requirements for great stability against unintentional trigger operations and a high trigger sensitivity, the auxiliary emitter electrode is connected by way of a semiconductor switch to the base layer adjacent the auxiliary emitter for increasing the trigger sensitivity. The thyristor may be employed in situations in which a high di/dt stability and a high dU/dt stability is desired.

13 Claims, 4 Drawing Figures

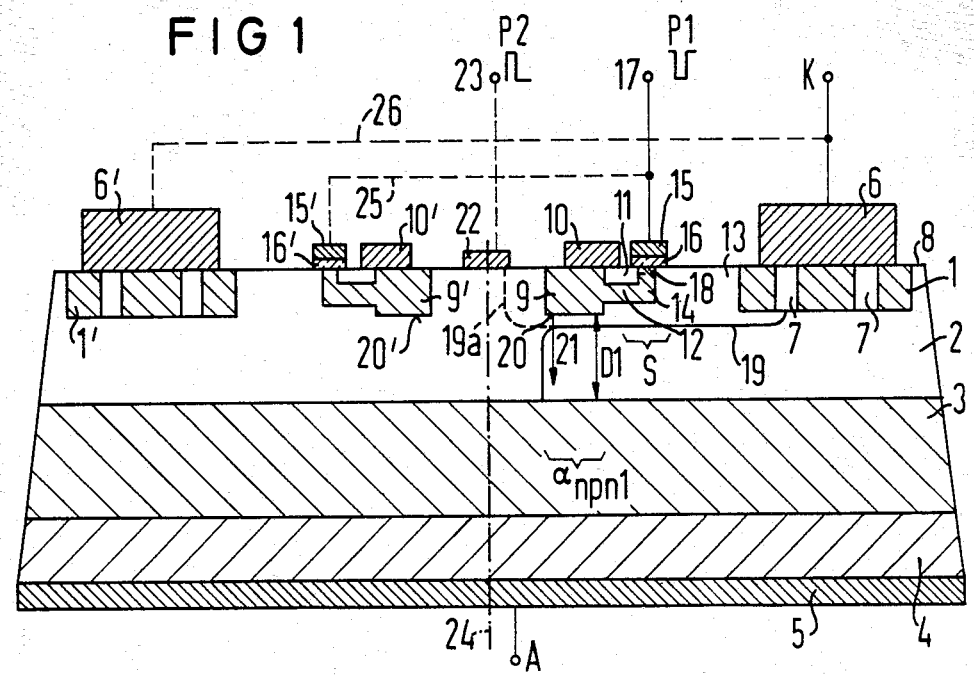
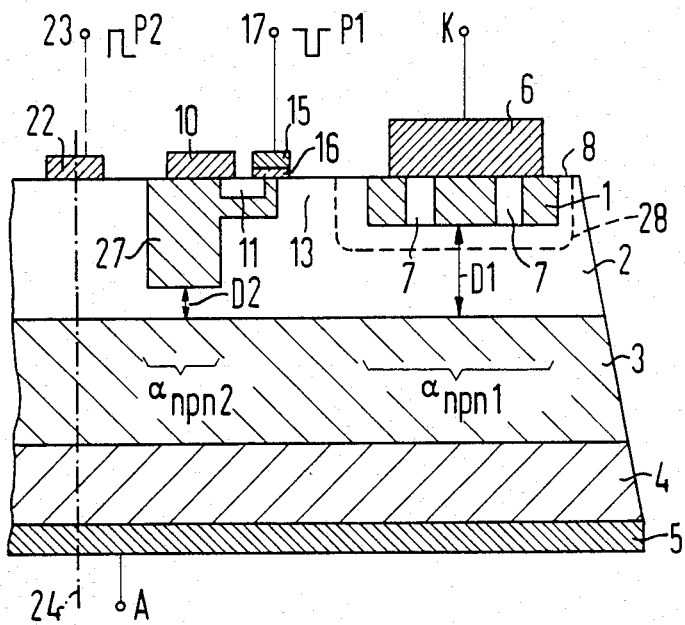

FET CONTROLLED THYRISTOR

BACKGROUND OF THE INVENTION

1. Field of the Invention

The present invention relates to a thyristor having internal current gain, and more particularly to a thyristor of that character in which there is a semiconductor body which contains an n-emitter contacted by a cathode, a p-emitter contacted by an anode and two base layers respectively adjacent thereto and therebetween and which has an auxiliary emitter which serves the purpose of internal current gain, the auxiliary emitter being contacted by an auxiliary emitter electrode.

2. Description of the Prior Art

A thyristor of the type generally set forth above is known from the "Thyristorhandbuch" by A. Hoffman and K. Stocker, Verlag Siemens AG, Berlin and Munich, 1965, pp. 27-28. The auxiliary emitter, which is there designated as an interstitial component, is permeated by a current when the thyristor is triggered, the current effecting a rapid and large-surface ignition in the area of the principle emitter. Because of the rapid sequence of the overall trigger operation, a thyristor of this type is suitable for high rise velocities of the load current flowing between the anode and cathode, i.e. it exhibits a high di/dt stability. Due to the auxiliary emitter, which is always more trigger-sensitive than the principle emitter, the stability of the thyristor, on the one hand, is lower than that of a thyristor having the same structure in which no measures for internal current gain are provided. What is thereby meant by stability is the protection of the thyristor against unintentional trigger operations given the occurrence of voltages poled in the forward-conducting direction which, under certain conditions, rise very quickly, i.e. represent a high dU/dt load.

SUMMARY OF THE INVENTION

It is therefore the object of the present invention to provide a thyristor having an internal current grain which largely meets the mutually-contradictory requirements for good stability and great trigger sensitivity.

The above object is achieved, according to the present invention, in that, in a thyristor of the type generally set forth above, the auxiliary emitter electrode is connected via a semiconductor switch to the base layer which is adjacent to the auxiliary emitter.

The advantage which may be attained in practicing the present invention, in particular, is that the auxiliary emitter is inoperative, on the one hand, in the non-conductive state of the semiconductor switch and does not reduce the stability of the thyristor, whereas, on the other hand, it increases the trigger sensitivity in the conductive state of the semiconductor switch. When the three-layer structure which comprises the auxiliary emitter and the two base layers is designed in such a manner that its current amplification factor relative to the charge carriers emitted by the auxiliary emitter is greater than the corresponding current amplification factor of the three-layer structure which comprises the principal emitter and the two base layers, then the attainable trigger sensitivity further increases with the difference of the current amplification factors.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a cross-sectional view through a first exemplary embodiment of the invention;

FIG. 2 is a cross-sectional view through a second exemplary embodiment of the invention;

DESCRIPTION OF THE PREFERRED EMBODIMENTS

Figure 3:
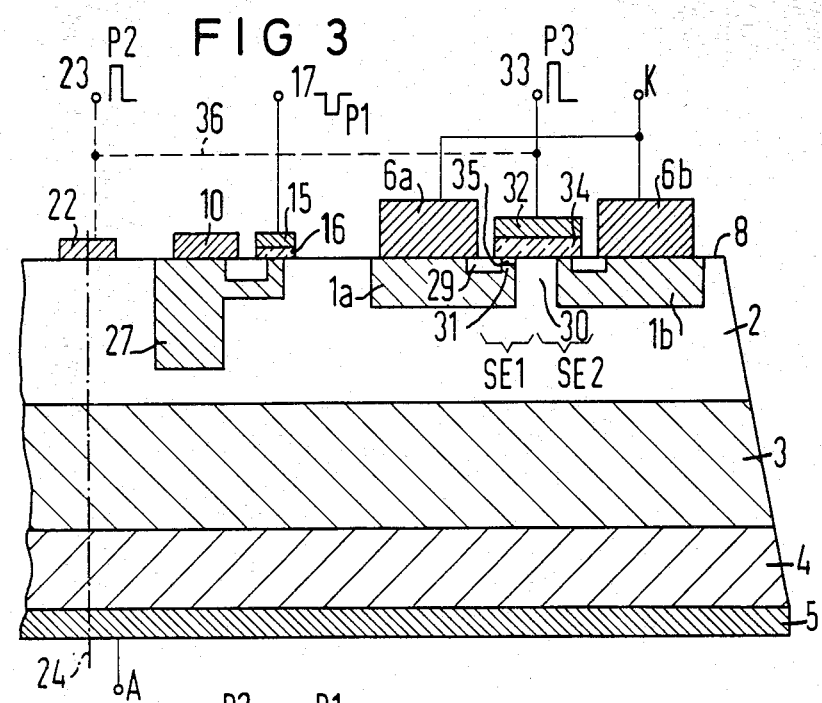
FIG. 3 is a cross-sectional view through a third exemplary embodiment of the invention.

Referring to FIG. 1, a thyristor is illustrated which comprises a semiconductor body including a doped semiconductor material, for example, silicon, having four layers of alternating conductivity type. An n-conductive layer 1 is designated as the n-emitter, a p-conductive layer 2 is designated as a p-base layer, and n-conductive layer 3 is designated as an n-base, and a p-emitter 4 is designated as a p-emitter. The p-emitter 4 is provided with an anode 5 which has a terminal A, whereas the n-emitter 1 is provided with a cathode 6 having a terminal K.

The n-emitter 1, which represents the principal emitter, is penetrated by a plurality of projections 7 of the p-base 2 which extend up to the boundary surface 8 of the semiconductor body and are conductively connected therein to the cathode 6. The projections 7 represent fixed emitter short circuits which largely prevent an unintentional triggering of the thyristor given application of a blocking voltage to the terminals A and K which place the anode 5 at a more positive potential than the cathode 6. This may be explained on the basis that the hole carriers transported under the influence of the blocking voltage in the direction toward the n-emitter 1 for the most part do not arrive at the pn junction between the elements 1 and 2, rather, arrive directly at the cathode 6 via the projections 7, so that they cannot trigger an emission of electrons from the n-emitter 1. Given an increasing plurality of the fixed emitter short circuits 7, the thyristor is also trigger-sensitive to larger or quickly-rising blocking voltages at the terminals A, K, i.e. is stable.

An n-conductive region 9 which represents the auxiliary emitter is inserted into the p-base 2 in such a manner that it extends up to the boundary surface 8. It is contacted by an auxiliary emitter electrode 10 at the boundary surface 8.

Differing from conventional thyristors having internal current gain, however, the auxiliary emitter electrode 10 is not directly connected to the p-base 2 but, rather, is connected via a semiconductor switch S. The semiconductor switch S, in the exemplary embodiment of FIG. 1, comprises a field effect transistor (FET) structure which is provided on or, respectively, in, the semiconductor body 1-4. The FET structure comprises a p-conductive semiconductor region 11 which is inserted into a projection 12 of the auxiliary emitter in such a manner that it extends up to the boundary surface 8 and is contacted thereat by a portion of the auxiliary emitter electrode 10. A second p-conductive semiconductor region is formed by a sub-region 13 of the p-base 2 lying between the auxiliary emitter 9 and the principle emitter 1. An edge region 14 of the auxiliary emitter 9 lies between the p-conductive semiconductor region 11 and the sub-region 13, the edge region 14 being covered by a gate 15 which is separated from the boundary surface 8 by a thin insulating layer 16 comprising, for example, silicon dioxide ($SiO_2$). The gate 15 is provided with a control voltage terminal 17. When the switch S is a matter of a FET structure of the enhancement type, then, given application of a control voltage to the terminal 17 which is negative in comparison to the potential at the terminal K and which exceeds the value of the cutoff voltage, an inversion channel 18 is formed at the boundary surface 8 below the gate 15. This p-conductive channel represents a low-resistant connection between the regions 11 and 13. When the voltage is disconnected from the terminal 17, then the channel 18 is eliminated and the connection between the regions 11 and 13 is interrupted. In a first switching state, the semiconductor switch S therefore connects the auxiliary emitter electrode 10 in a low-resistance manner to the p-base 2, so that the auxiliary emitter 9 is effective, whereas, in a second switching state, it disconnects the electrode 10 from the p-base 2, so that the auxiliary emitter 9 is inoperative. Therefore, the thyristor exhibits a connectible internal current gain.

In the following, the triggering of the thyristor of FIG. 1 is set forth. One proceeds from the fact that a voltage poling the thyristor in the forward-conducting direction is applied to the terminal A and K and a negative control voltage is supplied to the terminal 17. Under the influence of the former voltage, thermally-generated hole carriers, for example, move along a path 19 in the direction toward a fixed emitter short circuit 7, so that, given a conductive channel 18, a voltage drop arises at a point 20 which biases the pn junction between the auxiliary emitter 9 which has been switched on and p-base 2 to such a degree in the forward-conducting direction that electrons are emitted into the p-base 2 at this location. The electrons emitted by the auxiliary emitter 9 move in the direction of an arrow 21, whereby some of the same reach the boundary surface between the n-base 3 and the p-emitter 4 and occasion an emission of hole carriers from the p-emitter 4. These emission operations mutually promote one another until the layers 2 and 3 are flooded by emitted charge carriers, and the thyristor has triggered in the region of the auxiliary emitter 9. The load current flowing from the anode A across the auxiliary emitter 9, the auxiliary emitter electrode 10 and the switch S to the n-emitter 1 and to the cathode 6 thereby represents a high trigger current for the n-emitter 1.

As soon as the triggered surface of the thyristor, proceeding from the auxiliary emitter 9, has spread as a result of lateral diffusion of the charge carriers to such a degree that it at least partially co-involves the region of the n-emitter 1, the load current flowing between the anode A and the cathode K is completely assumed by that part of the thyristor cross-section which contains the triggered portion of the n-emitter 1. Therefore, a pulse-shaped control voltage P1 can be supplied to the terminal 17, being disconnected when the thyristor cross-section has become current-conducting in the region of the n-emitter 1.

For that case in which the trigger electrode 22 is disposed on the p-base 2, the ignition of the thyristor occurs at smaller voltages between the anode A and the cathode K than were assumed in the above considerations, occurring by means of a trigger current pulse P2 which is supplied via a trigger circuit connected at a terminal 23. The bias voltage at the circuit point 20 is thereby generated by hole carriers which derive from the semiconductor region below the trigger electrode 22 and arrive via the paths 19 and 19a indicated in FIG. 1 to a fixed short circuit 7. Thereby, the terminal 17 is simultaneously connected to the control voltage P1.

The thyristor is quenched when the load current falls below a so-called holding current. This occurs, for example, when the voltage is disconnected from the terminals A and K or, if it is a matter of an alternating current, upon occurrence of the next successive zero crossing.

Given an inoperatively switched auxiliary emitter 9, the thyristor is stable as a result of the fixed emitter short circuits 7, i.e. is trigger-insensitive to high or even rapidly-rising blocking voltages at the terminals A and K. On the other hand, however, it is made very trigger-sensitive by switching on the auxiliary emitter 9 with the pulse P1 in the trigger time.

For reasons of greater clarity, the principal of the invention has been explained on the basis of that portion of the thyristor lying to the right of the vertical center line 24 in FIG. 1. If, in FIG. 1, one proceeds from a rotational symmetrical format of the thyristor with the line 24 as the axis of symmetry, then annular embodiments of the elements 1, 9, 10, 6, 15 and 16 derive. The planes of section of these elements which lie to the left of the axis 24 are referenced 1', 9', 10', 6', 15' and 16'. The ignition of such a structure occurs along a circle containing the points 20 and 20' which is concentric to the axis 24.

On the other hand, the line 24 in FIG. 1 can also be interpreted as being a plane of symmetry perpendicular to the plane of the drawing. In this case, the elements 1, 9, 10, 6, 15 and 16 advantageously exhibit an elongate shape and extend with their larger dimensions perpendicular to the plane of the drawing, namely, preferably over the entire thyristor cross-section. The elements 1', 9', 10', 6', 15 and 16' then represent analogous sub-structures at the other side of the plane of symmetry which, relative to the latter, lie symmetrically relative to the elements 1, 9, 10, 6, 15 and 16. In this case, the gates 15 and 15' are connected to one another for the purpose of a common drive, this being indicated by means of a broken line 25. The cathode 6' is connected to the cathode 6, this also being indicated by a broken line 26.

The elements 1, 9, 10, 6, 15 and 16 can also be advantageously designed as strips and can be disposed at the boundary surface 8 in the form of a spiral or in some other curved shape.

The thyristor illustrated in FIG. 2 differs from that illustrated in FIG. 1 in that the auxiliary emitter 9 has been replaced by an auxiliary emitter 27 which extends further into the p-base 2 than does the n-emitter 1. If one assumes a penetration depth of, for example, 20 $\mu$m for the n-emitter 1, then the penetration depth of the auxiliary emitter 27 amounts to, for example, approximately 50 $\mu$m, whereby these numerical values are only cited for the purpose of illustrating the circuit structure and have no restrictive significance. The distance of the n-emitter 1 or, respectively, of the auxiliary emitter 9 (FIG. 1) from the boundary surface between the layers 2 and 3 is referenced DI, and the smaller distance of the auxiliary emitter 27 from the boundary of the layers 2 and 3 is referenced D2. A current amplification factor $\alpha_{npn2}$ for the npn structure formed by the elements 27, 2 and 3 derives for the electrons emitted by the auxiliary emitter 27 upon ignition of the thyristor, this being greater than the corresponding current amplification factor $\alpha_{npn1}$ of the structure comprising the elements 1, 2 and 3 or, respectively, the structure comprising the elements 9, 2 and 3 (FIG. 1) exhibiting the greater distance D1 because of the relatively small distance D2. The difference of the current amplification factors is to be explained on the basis of the fact that the recombination rate of the electrons emitted by the auxiliary emitter 27 is smaller, due to the smaller distance D2, than is the recombination rate of the electrons emitted by the n-emitter 1 or, respectively, by the auxiliary emitter 9. The trigger sensitivity of the thyristor illustrated in FIG. 2 is greater than that of the thyristor illustrated in FIG. 1 to the same degree that $\alpha_{npn2}$ is greater than $\alpha_{npn1}$.

A measure for increasing the stability of the thyristor and which is also independent of the penetration depth of the auxiliary emitter 27 is illustrated in FIG. 2. It comprises the provision of a sub-region 28 surrounding the n-emitter 1 in the p-base 2, the sub-region 28 exhibiting an additional p-doping so that its doping degree is higher than the remaining sub-regions of the p-base 2. This results in the fact that the three-layer structure of FIG. 2 comprising the elements 1, 2 and 3 exhibits a current amplification factor relative to the electrons emitted from the emitter 1—namely given the assumption of a voltage applied at the terminal A and K in the forward-conducting direction of the thyristor and given an inoperatively switched auxiliary emitter 27—which is smaller than the current amplification factor of this structure without the additionally doped sub-region 28. Given an impurity concentration in the p-base 2 of approximately $5 \times 10^{16}$ cm$^{-3}$, an impurity concentration of approximately $2 \times 10^{17}$ cm$^{-3}$, for example, comes into consideration for the sub-region 28, whereby these numerical specifications only serve for explaining the doping difference and are not to be interpreted as limiting values.

An increase in stability of the thyristor illustrated in FIG. 2 can also be achieved in such a manner that the sub-region 28 is not more strongly doped than the remaining portion of the p-base 2 but, rather, is instead provided with additional recombination centers. This occurs, for example, by irradiation of the p-base 2 before the generation of the n-emitter 1 with an electron beam which is limited to the sub-region 28. On the other hand, recombination centers can also be introduced in the form of gold or platinum atoms by diffusion or implantation into the sub-region 28.

The thyristor illustrated in FIG. 2 is operated in the same manner as the thyristor illustrated in FIG. 1.

The exemplary embodiment of the invention illustrated in FIG. 3 particularly differs from that illustrated in FIG. 2 in that, instead of the fixed emitter short circuits 7, controllable emitter short circuits are provided. To this end, the n-emitter 1 of FIG. 1 is subdivided into two or more emitter sub-regions 1a, 1b of which each is provided with a portion 6a or, respectively, 6b of the cathode. The portions 6a and 6b are connected to one another and are connected to a common cathode terminal K.

A controllable emitter short circuit SE1 in FIG. 3 comprises a p-conductive semiconductor region 29 located in the emitter sub-region 1a which extends up to the boundary surface 8 of the semiconductor body and is contacted thereat by the portion 6a of the cathode. The emitter sub-regions 1a and 1b are separated from one another by a region 30 of the p-base 2 which is to be interpreted as a second p-conductive semiconductor region of the controllable emitter short circuit. An edge area 31 of the emitter sub-region 1a which is n-conductive and extends from the boundary surface 8 lies between the regions 29 and 30. The edge area 31 is covered by a gate 32 which has a terminal 33 and which is separated from the semiconductor body by a thin, electrically insulating layer 34 comprising, for example, SiO$_2$. The elements 29-34 form a FET structure of the depletion type in which, without a control voltage being supplied to the terminal 33, a p-conductive channel 35 exists in the edge region 31 which connects the region 29 in a low-resistance manner to the region 30 and, thus, the portion 6a of the cathode in a low-resistance manner to the p-base 2. The channel 35 is either an inversion channel or a doped channel generated at the boundary surface 8 by p-doping. The emitter short circuit SE1 is thus switched on given a voltage-free terminal 33. When a positive control voltage P3 is supplied to the terminal 33, the channel 35 is eliminated and the low-resistance connection of the elements 2 and 6a is interrupted, i.e. the emitter short circuit SE1 is switched inoperative.

At the edge side relative to the emitter sub-region 1b, a further controllable emitter short circuit SE2 is provided in the thyristor of FIG. 3, which short circuit is constructed analogously to the emitter short circuit SE1. Thereby, the gate 32 is allocated in common to the emitter short circuits SE1 and SE2. The remaining circuit portions of the thyristor of FIG. 3 correspond to those portions of FIG. 1 and 1 and have been provided with the same reference characters.

Instead of the two illustrated emitter sub-regions 1a and 1b, a plurality of correspondingly-designed emitter sub-regions, or even only one such sub-region, for example, 1a or 1b, can be provided given the exemplary embodiment according to FIG. 3.

A particularly high stability is achieved with the exemplary embodiment according to FIG. 3, namely, when a larger plurality of emitter sub-regions 1a, 1b . . . etc and a correspondingly large plurality of controllable emitter short circuits SE1, SE2 . . . etc are provided. These are switched inoperative by a positive control voltage, for example, a pulse-shaped control voltage P3, which is applied to the terminal 33 at the triggering time, so that the propagation of the triggered front over the entire thyristor cross-section is not impeded by the emitter short circuits. When the thyristor cross-section has become current-conducting in the region of the emitter sub-regions 1a, 1b, the control voltage can be disconnected, as indicated by the pulse shape of the control voltage P3. When a terminal 23 is provided as an ignition terminal to which an ignition current pulse P2 is supplied, then the terminal 33 can be connected to the terminal 23, as indicated by a broken line 36, in order to be able to employ the voltage at the terminal 23 as a control voltage P3. The control of the terminal 17 occurs in the manner explained above with respect to FIG. 1.

The previously-described FET structures, for example, 29-34, of the depletion type can also be replaced by FET structures of the enhancement type when their gate terminals, for example, the terminal 33, have an additional negative control voltage supplied thereto which permits the inversion channels, for example, the channel 35, to arise. The control voltage P3 is then superimposed on the additional control voltage in the trigger time in order to eliminate the channels.

Figure 4:
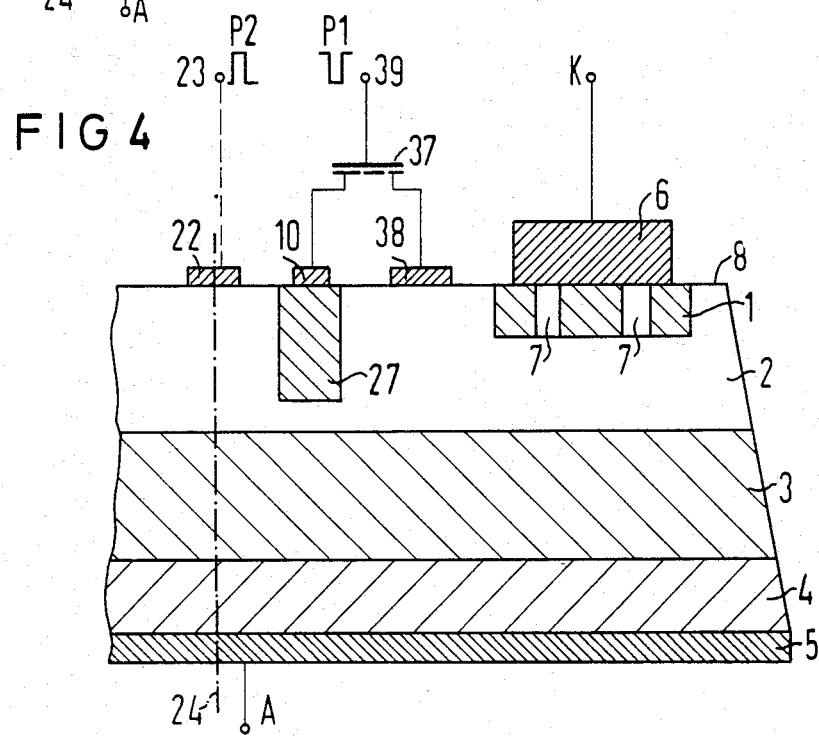
FIG. 4 is a cross-sectional view through a fourth exemplary embodiment of the invention.

FIG. 4 illustrates an exemplary embodiment of the invention in which the auxiliary emitter 27 is conductively connected to the p-base 2 via a semiconductor switch in the form of an external field effect transistor 37. In this case, the source-drain path of the transistor 37 is connected, on the one hand, to the auxiliary emitter electrode 10 and, on the other hand, to a conductive coating 38 which contacts the p-base 2. The auxiliary emitter electrode 10 thereby does not project beyond the lateral dimensions of the auxiliary emitter 27. The gate of the transistor 37 is provided with a control voltage terminal 39. The operation of the thyristor according to FIG. 4 occurs in the same manner described for the thyristor of FIG. 1, whereby the terminal 39 corresponds to the terminal 17 and, given a p-channel FET 37, has a control voltage P1 applied thereto, whereas the terminal 23 has, if necessary, an ignition current pulse P2 applied thereto.

Given an n-channel FET 37, a positive control voltage pulse is supplied to the terminal 39 for switching the auxiliary emitter 27 on. Given a connection of the terminals 23 and 39, the latter control voltage pulse can comprise the voltage which drops off at the terminal 23 as a result of the control current pulse P2.

Within the scope of the invention, the auxiliary emitter can also be p-conductive, laterally disposed next to the p-emitter in the n-base of the thyristor, and can be connected in a low-resistance manner to the n-base via a semiconductor switch in order to produce a high trigger sensitivity. In this case, the fixed or controllable emitter short circuits are then also provided in the region of the p-emitter. In all figures this can be illustrated by reversing the designations of the terminals A and K, reversing the conductivity types of the elements, and reversing the polarities of the control voltages and the control currents.

The exemplary embodiments according to FIGS. 2-4 can, corresponding to that of FIG. 1, respectively be centrically symmetrically designed relative to an axis of symmetry 24 or can be respectively symmetrically constructed relative to a plane which is perpendicular to the plane of the drawing and is indicated by the line 24.

The elements 1, 1a, 1b, 6a, 6b, 10, 15, 16, 27, 32 and 34 of FIGS. 2-4 can also be advantageously designed as strips and can be disposed at the boundary surface 8 in the form of a spiral or in some other curved form.

The exemplary embodiments according to FIGS. 2 and 3 can also be equipped with a semiconductor switch in the form of an external transistor. Furthermore, the fixed emitter short circuits 7 in the appertaining embodiments can be replaced by controllable emitter short circuits, for example, the controllable emitter short circuits SE1, SE2.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a thyristor of the type including a semiconductor body having a boundary surface and including a first emitter of a first conductivity type, a first base of a second, opposite conductivity type carrying said first emitter, a second base of the first conductivity type carrying and forming a pn junction with said first base, a second emitter of the second conductivity type carrying said second base, a pair of emitter electrodes having respective terminals for connection to a load respectively carried on said first and second emitters, and an auxiliary emitter of the first conductivity type for internal current gain located in said first base spaced from said first emitter and extending to said boundary surface and carrying an auxiliary emitter electrode at said boundary surface, the improvement therein comprising:
    a semiconductor switch connected between and operable to electrically connect and disconnect said auxiliary emitter electrode and said first base adjacent said auxiliary emitter
wherein:
    said first and second bases and said first emitter form a first structure having a first amplification factor $\alpha_1$; said first and second bases and said auxiliary emitter form a second structure having a second amplification factor $\alpha_2$;
and
    with a blocking voltage applied to said pair of emitter electrodes, the amplification factor $\alpha_2$ is greater relative to the charge carriers emitted by said auxiliary emitter than the amplification factor $\alpha_1$.

2. The improved thyristor of claim 1, wherein: said first emitter is a p-conductivity emitter.

3. The improved thyristor of claim 1, wherein: said first emitter is an n-conductivity emitter.

4. The improved thyristor of claim 1, and further comprising:
    a semiconductor region of the second conductivity type in said auxiliary emitter extending to said boundary surface and contacting a portion of said auxiliary emitter electrode, said region connected to said first base by said semiconductor switch.

5. The improved thyristor of claim 1, wherein said semiconductor switch comprises:
    a first semiconductor region in said auxiliary emitter extending up to said boundary surface and contacting a portion of said auxiliary emitter electrode; a second region of said first base adjacent said auxiliary emitter;
    an edge region of said auxiliary emitter between said first and second regions;
    an insulated gate carried on said boundary surface over said edge region and bridging respective portions of said first and second regions; and
    a control voltage terminal connected to said gate.

6. The improved thyristor of claim 1, wherein said semiconductor switch comprises:
    an external field effect transistor including a source-drain path connected between said auxiliary emitter electrode and said first base, said auxiliary emitter electrode including a lateral dimension which is less than that of said auxiliary emitter, a gate, and a control voltage terminal connected to said gate.

7. The improved thyristor of claim 1, wherein: the distance of said auxiliary emitter is less than the distance of said first emitter to the pn junction of said bases.

8. The improved thyristor of claim 1, and further comprising:
    a region of said first base surrounding said first emitter, said region including a doping concentration which is greater than that of that portion of said first base which surrounds said auxiliary emitter.

9. The improved thyristor of claim 1, and further comprising:
   at least one fixed emitter short circuit comprising a projection of said first base through said first emitter and contacting the appertaining emitter electrode.

10. The improved thyristor of claim 1, and further comprising:
    at least one controllable emitter short circuit comprising a first semiconductor region of the second conductivity type in said first emitter and extending to said boundary surface, a second semiconductor region of said first base adjacent said first emitter and extending to said boundary surface, a third semiconductor region of said first emitter between said first and second semiconductor regions, an insulated gate bridging said first, second and third regions, and a control voltage terminal connected to said insulated gate.

11. The improved thyristor of claim 1, and further comprising:
    a trigger electrode carried on said first base; and
    a terminal connected to said trigger electrode for connection to a triggering circuit.

12. The improved thyristor of claim 1, wherein:
    said semiconductor body has a second boundary surface on said second emitter; and
    said pair of electrodes constitute an anode and a cathode carried on said boundary surfaces.

13. In a thyristor of the type including a semiconductor body having a boundary surface and including a first emitter of a first conductivity type, a first base of a second, opposite conductivity type carrying said first emitter, a second base of the first conductivity type carrying and forming a pn junction with said first base, a second emitter of the second conductivity type carrying said second base, a pair of electrodes having respective terminals for connection to a load respectively carried on said first and second emitters, and an auxiliary emitter of the first conductivity type for internal current gain located in said first base spaced from said first emitter and extending to said boundary surface and carrying an auxiliary emitter electrode at said boundary surface, the improvement therein comprising:
    a semiconductor switch connected between and operable to electrically connect and disconnect said auxiliary emitter electrode and said first base adjacent said auxiliary emitter, said first and second bases and said first emitter forming a first structure having a first amplification factor $\alpha_1$,
    said first and second bases and said auxiliary emitter forming a second structure having a second amplification factor $\alpha_2$,
    with a blocking voltage applied to said pair of emitter electrodes, the amplification factor $\alpha_2$ is greater relative to the charge carriers emitted by said auxiliary emitter than the amplification factor $\alpha_1$; and
    a region of said first base surrounding said first emitter and including a greater plurality of recombination centers than does the region of said first base which surrounds said auxiliary emitter.

* * * * *